(12) United States Patent
You et al.

(10) Patent No.: US 12,182,416 B2
(45) Date of Patent: Dec. 31, 2024

(54) MEMORY DEVICE AND MEMORY SYSTEM INCLUDING THE SAME

(71) Applicant: SAMSUNG ELECTRONICS CO., LTD., Suwon-si (KR)

(72) Inventors: Jung Min You, Hwaseong-si (KR); Seong-Jin Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 122 days.

(21) Appl. No.: 17/885,822

(22) Filed: Aug. 11, 2022

(65) Prior Publication Data

US 2023/0146377 A1 May 11, 2023

(30) Foreign Application Priority Data

Nov. 9, 2021 (KR) .................. 10-2021-0153249
Dec. 21, 2021 (KR) .................. 10-2021-0184027

(51) Int. Cl.
*G11C 11/406* (2006.01)
*G06F 3/06* (2006.01)
*G06F 12/02* (2006.01)
*G11C 7/10* (2006.01)

(52) U.S. Cl.
CPC .......... *G06F 3/0619* (2013.01); *G06F 3/0629* (2013.01); *G06F 3/0673* (2013.01); *G06F 12/0238* (2013.01); *G11C 7/1045* (2013.01); *G11C 11/406* (2013.01); *G11C 11/40611* (2013.01); *G06F 2212/70* (2013.01); *G11C 11/40622* (2013.01)

(58) Field of Classification Search
CPC .................. G06F 3/0619; G11C 11/40622
See application file for complete search history.

(56) References Cited

U.S. PATENT DOCUMENTS

| | | | |
|---|---|---|---|
| 9,032,141 B2 | 5/2015 | Bains et al. | |
| 9,286,964 B2 | 3/2016 | Halbert et al. | |
| 9,437,275 B2 | 9/2016 | Kim et al. | |
| 9,761,298 B2 | 9/2017 | Halbert et al. | |
| 9,892,779 B2 | 2/2018 | Kang et al. | |
| 9,978,440 B2 | 5/2018 | Cho | |
| 10,446,199 B2 | 10/2019 | Hyun et al. | |
| 10,600,470 B2 | 3/2020 | Bang | |
| 10,607,680 B2 * | 3/2020 | Jin | G06F 11/004 |
| 2003/0135699 A1 * | 7/2003 | Matsuzaki | G11C 8/18 |
| | | | 711/149 |
| 2004/0027900 A1 * | 2/2004 | Lee | G11C 7/1063 |
| | | | 365/222 |
| 2005/0259493 A1 * | 11/2005 | Walker | G11C 11/406 |
| | | | 365/222 |
| 2013/0182522 A1 * | 7/2013 | Lim | G11C 11/406 |
| | | | 365/222 |
| 2015/0043295 A1 * | 2/2015 | Kim | G11C 11/406 |
| | | | 365/222 |

(Continued)

*Primary Examiner* — Sung Il Cho
(74) *Attorney, Agent, or Firm* — Muir Patent Law, PLLC

(57) ABSTRACT

According to an embodiment, a memory device includes a memory cell array including a plurality of memory cells; and a control logic which includes a mode register, performs a refresh operation in response to a refresh command, generates an internal mode register write command in response to the refresh command in a first mode, and does not generate the internal mode register write command in response to the refresh command in a second mode.

14 Claims, 9 Drawing Sheets

(56) References Cited

U.S. PATENT DOCUMENTS

2015/0162068 A1* 6/2015 Woo ................ G11C 11/40615
                                                                365/222
2021/0225432 A1   7/2021 Enomoto et al.

\* cited by examiner

| Type | OP[7] | OP[6] | OP[5] | OP[4] | OP[3] | OP[2] | OP[1] | OP[0] |
|---|---|---|---|---|---|---|---|---|
| MR64 | BA0 | BA1 | BA2 | RFU | RFU | RFU | ENABLE | RFU |
| MR65 | RA15 | RA14 | RA13 | RA12 | RA11 | RA10 | RA9 | RA8 |
| MR66 | RA7 | RA6 | RA5 | RA4 | RA3 | RA2 | RA1 | RA0 |

| Type | OP[7] | OP[6] | OP[5] | OP[4] | OP[3] | OP[2] | OP[1] | OP[0] |
|---|---|---|---|---|---|---|---|---|
| MR64 | BA0 | BA1 | BA2 | RFU | RFU | RFU | ENABLE | RFU |
| MR65 | RFU | RFU | RFU | RFU | RFU | RFU | RFU | RFU |
| MR66 | RA15 | RA14 | RA13 | RA12 | RA11 | RA10 | RA9 | RA8 |
| MR67 | RA7 | RA6 | RA5 | RA4 | RA3 | RA2 | RA1 | RA0 |

| Type | OP[7] | OP[6] | OP[5] | OP[4] | OP[3] | OP[2] | OP[1] | OP[0] |
|---|---|---|---|---|---|---|---|---|
| MR64 | BA0 | BA1 | BA2 | RFU | RFU | RFU | RFU | RFU |
| MR65 | RA15 | RA14 | RA13 | RA12 | RA11 | RA10 | RA9 | RA8 |
| MR66 | RA7 | RA6 | RA5 | RA4 | RA3 | RA2 | RA1 | RA0 |
| MR67 | RFU | RFU | RFU | RFU | RFU | RFU | RFU | ENABLE |

2000

MEMORY DEVICE AND MEMORY SYSTEM INCLUDING THE SAME

CROSS-REFERENCE TO RELATED APPLICATIONS

This application claims priority under 35 U.S.C. § 119 from Korean Patent Application No. 10-2021-0153249 filed on Nov. 9, 2021, and Korean Patent Application No. 10-2021-0184027 filed on Dec. 21, 2021, in the Korean Intellectual Property Office, the disclosure of each of which is incorporated herein by reference in its entirety.

BACKGROUND

1. Field

Embodiments relate to a memory device and a memory system including the same.

2. Description of the Related Art

In volatile memory devices such as a dynamic random access memory (DRAM), cell charges stored in memory cells may be lost due to a leakage current. Before cell charges are lost and data is damaged, the memory cell should be recharged with cell charges. An operation of recharging the memory cell with cell charges is referred to as a refresh operation. Such a refresh operation is repeatedly performed to avoid loss of cell charges.

SUMMARY

According to an embodiment, a memory device includes a memory cell array including a plurality of memory cells; and a control logic which includes a mode register, performs a refresh operation in response to a refresh command, generates an internal mode register write command in response to the refresh command in a first mode, and does not generate the internal mode register write command in response to the refresh command in a second mode.

According to an embodiment, a memory system includes a memory controller configured to generate a refresh command; and a memory device which includes a memory cell array including a plurality of memory cells and a control logic including a mode register and configured to perform a refresh operation in response to the refresh command, wherein the memory device stores a bank address and a row address, on which the refresh operation is performed, in the mode register or outputs the bank address and the row address to the memory controller.

According to an embodiment, a memory device includes a memory cell array including a plurality of memory cells; and a control logic including a mode register, wherein: the control logic outputs a first bank address and a first row address in response to a mode register read command in at least a portion of a period in which a first refresh operation is performed by receiving a first refresh command and outputs a second bank address and a second row address in response to the mode register read command in at least a portion of a period in which a second refresh operation is performed by receiving a second refresh command; the second bank address is different from the first bank address; and the second row address is different from the first row address.

BRIEF DESCRIPTION OF THE DRAWINGS

Features will become apparent to those of skill in the art by describing in detail example embodiments with reference to the attached drawings in which.

DETAILED DESCRIPTION

Figure 1:
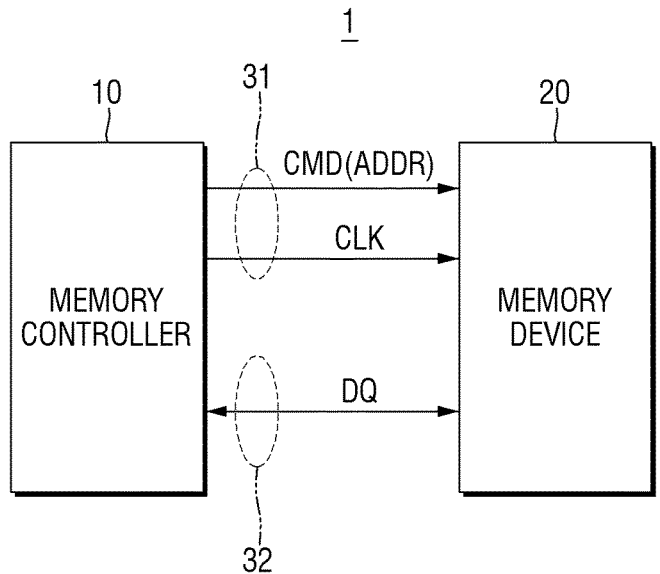
FIG. 1 is a block diagram for describing a memory system according to some example embodiments.

FIG. 1 is a block diagram for describing a memory system according to some example embodiments.

Referring to FIG. 1, a memory system 1 according to some example embodiments may include a memory controller 10 and a memory device 20.

Each of the memory controller 10 and the memory device 20 includes an interface for mutual communication. The interface may be connected through a control bus 31 for transmitting a command CMD, an address ADDR, a clock signal CLK, and the like, and a data bus 32 for transmitting data. The command CMD may be considered to include the address ADDR.

The memory controller 10 may generate the command CMD for controlling the memory device 20. Under the control of the memory controller 10, data DQ may be written to or read from the memory device 20.

Figure 2:
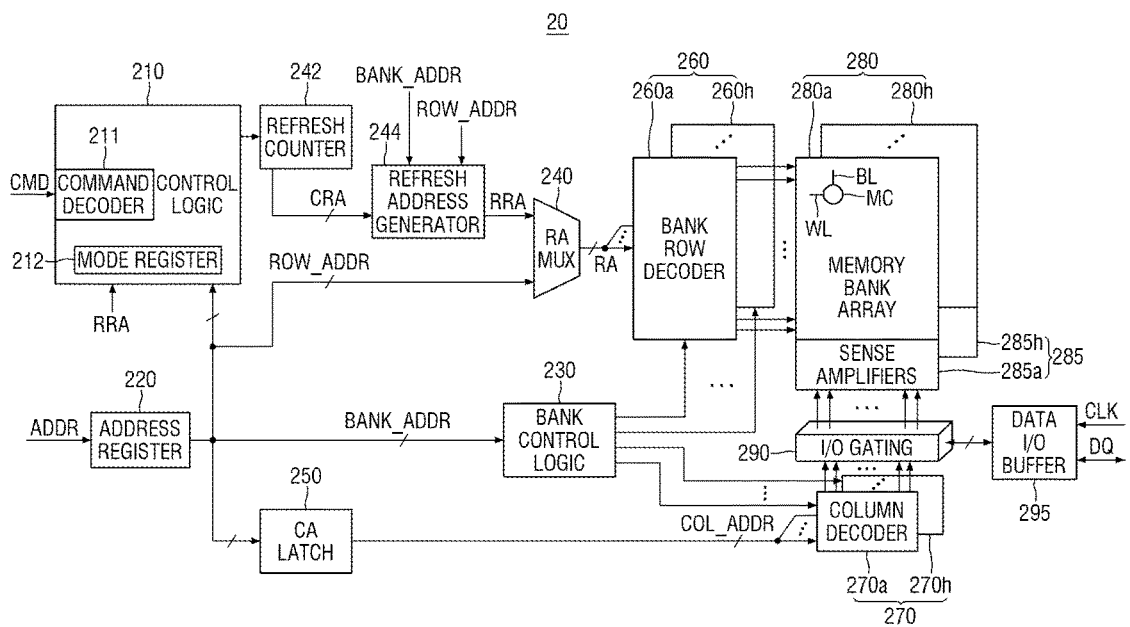
FIG. 2 is a block diagram for describing a memory device of FIG. 1.

FIG. 2 is a block diagram for describing the memory device of FIG. 1.

Referring to FIG. 2, the memory device 20 may include a control logic 210, an address register 220, a bank control logic 230, a row address multiplexer 240, a refresh counter 242, a refresh address generator 244, a column address latch 250, a row decoder 260, a column decoder 270, a memory cell array 280, a sense amplifier unit 285, an input/output gating circuit 290, and a data input/output buffer 295.

The memory cell array 280 may include a plurality of memory bank arrays 280a to 280h. In FIG. 2, eight memory bank arrays 280a to 280h are illustrated as being included, but this may be varied.

Each of the plurality of memory bank arrays 280a to 280h may include a plurality of word lines WL, a plurality of bit lines BL, and a plurality of memory cells MC formed at intersections between the word lines WL and the bit lines BL.

The row address multiplexer 240 may include a plurality of bank row decoders 260a to 260h respectively connected to the plurality of memory bank arrays 280a to 280h. The column decoder 270 may include a plurality of column decoders 270a to 270h respectively connected to the plurality of memory bank arrays 280a to 280h. The sense amplifier unit 285 may include a plurality of sense amplifiers 285a to 285h respectively connected to the plurality of memory bank arrays 280a to 280h.

The address register 220 may receive the address ADDR including a bank address BANK_ADDR, a row address ROW_ADDR, and a column address COL_ADDR from the memory controller 10 of FIG. 1. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. In response to the bank control signals, a bank row decoder corresponding to the bank address BANK_ADDR among the plurality of bank row decoders 260a to 260h may be activated, and a column decoder corresponding to the bank address BANK_ADDR among the plurality of column decoders 270a to 270h may be activated.

The refresh counter 242 may sequentially output counting row addresses CRA under the control of the control logic 210. For example, the control logic 210 may generate a refresh count signal in response to a normal refresh command. The refresh counter 242 may perform a counting operation in response to the refresh count signal and output the counting row address CRA. That is, the refresh counter 242 may output a refresh address for performing a normal refresh operation.

The refresh address generator 244 may receive the bank address BANK_ADDR and the row address ROW_ADDR. The refresh address generator 244 may count values at which the bank address BANK_ADDR and the row address ROW_ADDR are activated based on the bank address BANK_ADDR and the row address ROW_ADDR. The refresh address generator 244 may generate a row address corresponding to a word line activated a predetermined number of times or more based on the counted value or a row address corresponding to a word line adjacent to the word line as a hammer address. That is, the refresh address generator 244 may output a refresh address for performing a target row refresh operation.

The refresh address generator 244 may output any one of the counting row address CRA and the hammer address as a refresh row address RRA.

The refresh counter 242 and the refresh address generator 244 may be implemented as separate components or may be implemented as a single component. In addition, the refresh counter 242 and the refresh address generator 244 may be implemented to be included in the control logic 210.

The row address multiplexer 240 may receive the row address ROW_ADDR from the address register 220, and may receive the refresh row address RRA from the refresh address generator 244. The row address multiplexer 240 may selectively output the row address ROW_ADDR or the refresh row address RRA as a row address RA. The row address RA output from the row address multiplexer 240 may be applied to each of the plurality of bank row decoders 260a to 260h.

A bank row decoder activated by the bank control logic 230 among the plurality of bank row decoders 260a to 260h may decode the row address RA output from the row address multiplexer 240 to activate a word line corresponding to the row address. For example, the activated bank row decoder may apply a word line driving voltage to the word line corresponding to the row address.

The column address latch 250 may receive the column address COL_ADDR from the address register 220, and may temporarily store the received column address COL_ADDR. The column address latch 250 may gradually or incrementally increase the received column address COL_ADDR in a burst mode. The column address latch 250 may apply the column address COL_ADDR, which is temporarily stored or gradually increased, to each of the plurality of column decoders 270a to 270h.

A bank column decoder activated by the bank control logic 230 among the plurality of column decoders 270a to 270h may activate a sense amplifier corresponding to the bank address BANK_ADDR and the column address COL_ADDR through the corresponding input/output gating circuit 290.

The input/output gating circuit 290 may include an input data mask logic, read data latches for storing data output from the plurality of memory bank arrays 280a to 280h, and write drivers for writing data to the plurality of memory bank arrays 280a to 280h in addition to circuits for gating input/output data.

The data DQ to be read from one bank array among the plurality of memory bank arrays 280a to 280h may be detected by a sense amplifier corresponding to the one bank array (one among the sense amplifiers 285a to 285h) and may be stored in the read data latches. The data DQ stored in the read data latches may be provided to the memory controller 10 through the data input/output buffer 295.

The data DQ to be written to one bank array among the plurality of memory bank arrays 280a to 280h may be provided to the input/output gating circuit 290, and the input/output gating circuit 290 may write the data to the one bank array through the write drivers.

The control logic 210 may control the operation of the memory device 20. For example, the control logic 210 may generate control signals to cause the memory device 20 to perform a write operation or a read operation. The control logic 210 may include a command decoder 211 for decoding the command CMD received from the memory controller 10 and a mode register 212 for setting an operation mode of the memory device 20 based on a mode register set MRS.

The command CMD may include, for example, an active command for enabling the memory cell array 280 to enter an active state so as to write or read data, a precharge command for enabling the memory cell array 280 to enter a standby state, a refresh command for controlling a refresh operation on the memory cell array 280, a command for setting the mode register 212, and the like.

In some example embodiments, the control logic 210 may store an address, on which a refresh operation is performed, in response to the refresh command. The control logic 210 may store, for example, the address, on which the refresh operation is performed, in the mode register 212.

In some example embodiments, the control logic 210 may output the address, on which the refresh operation is performed, in response to the refresh command. The address on which the refresh operation is performed may be output to the memory controller 10 through the data input/output buffer 295.

The memory cell MC may be, for example, a dynamic random access memory (DRAM) memory cell. Each of the memory cells MC may be connected to one word line WL and one bit line BL. The memory cell MC may store electric charges through a cell capacitor. Since a leakage current occurs in the memory cell MC due to a structure of the memory cell MC, data stored in the cell capacitor may be lost.

As described above, the memory device 20 may perform a refresh operation for recharging data in the memory cell MC so as to prevent data stored in the memory cell MC from being changed by a leakage current.

Figure 3:
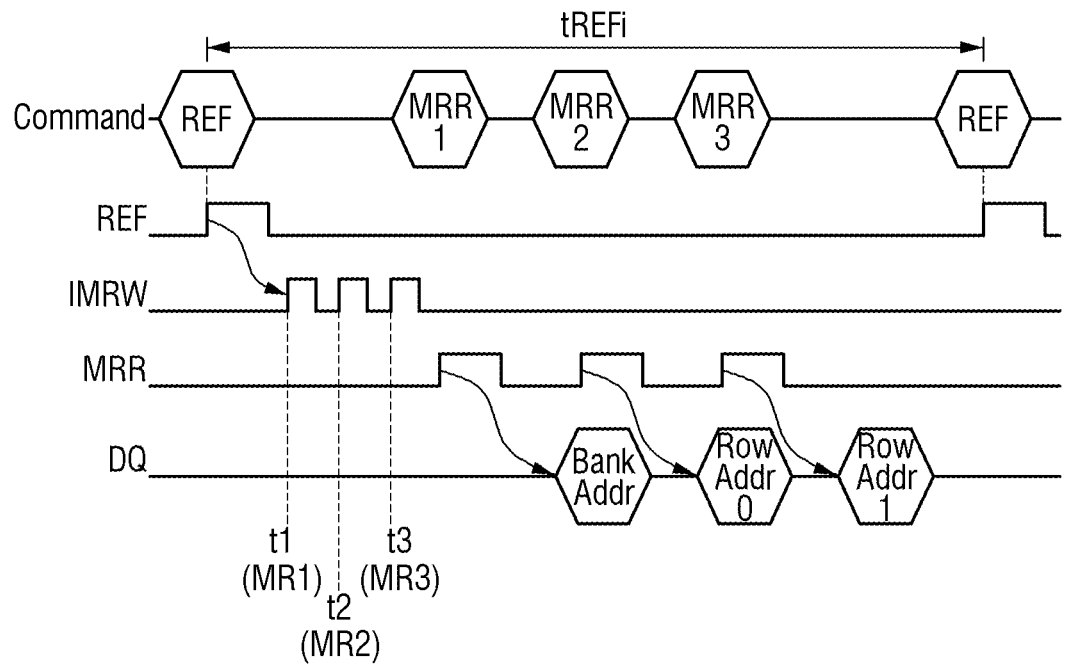
FIG. 3 is a diagram for describing the operation of a memory device according to some example embodiments.
Figure 4:
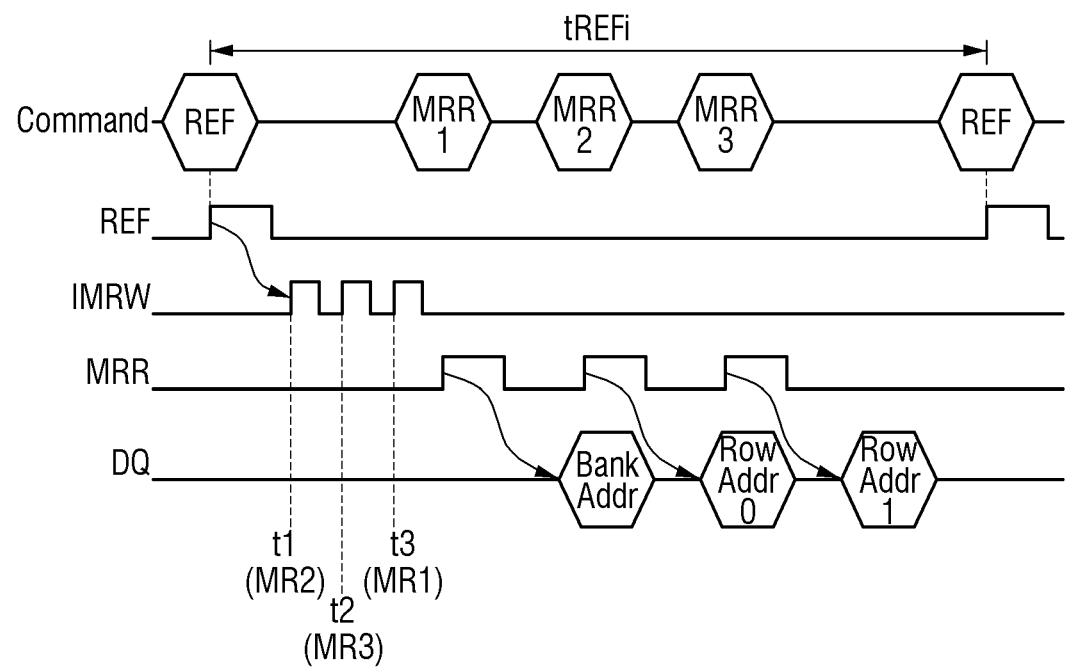
FIG. 4 is an example diagram for describing a mode register.

FIG. 3 is a diagram for describing the operation of a memory device according to some example embodiments. FIG. 4 is an example diagram for describing a mode register.

Referring to FIGS. 2 and 3, in some example embodiments, the control logic 210 may store a bank address and a row address, on which a refresh operation is performed, in the mode register 212 in response to a refresh command REF.

Specifically, the control logic 210 may receive the refresh command REF every refresh period tREFi. The control logic 210 may internally generate a command in response to the refresh command REF. The control logic 210 may generate an internal mode register write command IMRW in response to the refresh command REF.

The control logic 210 may store a bank address and a row address, on which a refresh command is performed, in the mode register 212 in response to the internal mode register write command IMRW. For example, the control logic 210 may generate a plurality of internal mode register write commands IMRW. The control logic 210 may generate the internal mode register write command IMRW for writing a bank address, on which a refresh command is performed, to the mode register 212, and the internal mode register write command IMRW for writing a row address, on which a refresh command is performed, to the mode register 212

In this case, the number of the internal register write commands IMRW generated by the control logic 210 may be determined according to bits of the row address, bits of the bank address, and bits of the mode register defined by a specification of a memory device 20.

For example, when the memory device 20 is a double data rate 5 (DDR5) synchronous DRAM (SDRAM), the bank address may be composed of 3 bits, the row address may be composed of 16 bits, and the mode register may be composed of 8 bits. Accordingly, three mode registers may be used to store the bank address and the row address on which the refresh operation is performed. The control logic 210 may generate three internal mode register write commands IMRW in response to the refresh command REF.

In addition, the control logic 210 may perform a write operation on different mode registers 212 in response to each internal mode register write command IMRW. That is, when three internal mode register write commands IMRW are generated, a write operation may be performed on three mode registers 212. In this case, the mode registers 212, to which a bank address and a row address on which a refresh operation is performed are written, may be blank mode registers according to the specification of the memory device 20. Each of the mode registers 212, to which the bank address and the row address on which the refresh operation is performed are written, may be predetermined.

For example, referring to FIGS. 3 and 4, first to third mode registers MR1, MR2, and MR3 may be blank mode registers according to the specification of the memory device 20. In addition, the first mode register MR1 may be preset such that a bank address on which a refresh operation is performed is written, and the second and third mode registers MR2 and MR3 may be preset such that a row address on which a refresh operation is performed is written.

An order may vary in which the control logic 210 generates the internal mode register write command IMRW for instructing a row address, on which a refresh operation is performed, to be written to the mode register 212 and the internal mode register write command IMRW for instructing a bank address, on which a refresh operation is performed, to be written to the mode register 212.

For example, referring to FIG. 3, in response to the internal mode register write command IMRW generated at a time point t1, the control logic 210 may write a bank address, on which a refresh operation is performed, to the first mode register MR1 of the mode register 212. In response to the internal mode register write command IMRW generated at a time point t2, the control logic 210 may write some row addresses, on which a refresh operation is performed, to the second mode register MR2 of the mode register 212. In response to the internal mode register write command IMRW generated at a time point t3, the control logic 210 may write the rest of the row addresses, on which the refresh operation is performed, to the third mode register MR3 of the mode register 212.

For example, referring to FIG. 4, in response to the internal mode register write command IMRW generated at the time point t1, the control logic 210 may write some row addresses, on which a refresh operation is performed, to the second mode register MR2. In response to the internal mode register write command IMRW generated at the time point t2, the control logic 210 may write the rest of the row addresses, on which the refresh operation is performed, to the third mode register MR3 of the mode register 212. In response to the internal mode register write command IMRW generated at the time point t3, the control logic 210 may write a bank address, on which a refresh operation is performed, to the first mode register MR1 of the mode register 212.

Accordingly, a bank address and a row address on which a refresh operation is performed may be read using a mode register read command MRR. For example, a memory controller 10 (see FIG. 1) may issue the mode register read command when a predetermined time has elapsed after the refresh command REF is issued. The memory device 20 may output a bank address and a row address, on which a refresh operation is performed, in response to the mode register read command.

For example, the control logic 210 may read a bank address Bank Addr in response to a mode register read command MRR1 for the first mode register MR1. The control logic 210 may read row addresses Row Addr0 and Row Addr1 in response to mode register read commands MRR2 and MRR3 for the second mode register MR2 and the third mode register MR3.

When the memory device 20 is analyzed while the memory device 20 performs a normal refresh operation and a target refresh operation, it is difficult to track an address on which a refresh operation is performed.

However, the memory device 20 according to some example embodiments may output the bank address Bank Addr and the row addresses Row Addr0 and Row Addr1, on which a refresh operation is performed, irrespective of the normal refresh operation or the target refresh operation. Accordingly, it is possible to identify whether the memory device 20 has performed a refresh operation on an intended row address so that it is possible to improve or enhance accuracy in verifying the operation of the memory device 20 or analyzing a defect thereof.

Figures 5, 6, 7:
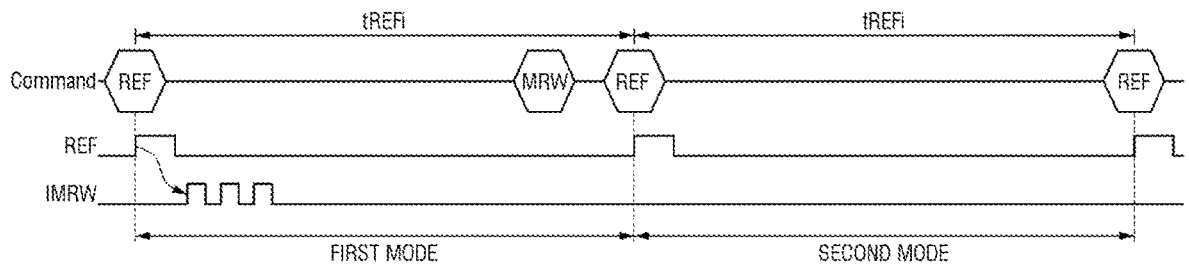
FIG. 5 is an example diagram for describing a mode register.
FIG. 6 is a diagram for describing the operation of a memory device according to some example embodiments.
FIG. 7 is an example diagram for describing a mode register.

FIG. 5 is an example diagram for describing a mode register.

Referring to FIG. 5, in some example embodiments, a bank address and a row address on which a refresh operation is performed may be stored in mode registers MR64, MR65, and MR66 which are consecutive among the blank mode registers MR64, MR65, and MR66 according to a specification of a memory device.

For example, bank addresses BA0, BA1, and BA2 may be stored in storage areas OP[7], OP[6], and OP[5], respectively, of the mode register MR64. Row addresses RA8 to RA15 may be stored in storage areas OP[0], OP[1], OP[2], OP[3], OP[4], OP[5], OP[6], and OP[7], respectively, of the mode register MR65. Row addresses RA0 to RA7 may be stored in storage areas OP[0], OP[1], OP[2], OP[3], OP[4], OP[5], OP[6], and OP[7], respectively, of the mode register MR66. The mode register MR64, the mode register MR65, and the mode register MR66 may be consecutive. In FIG. 5, RFU indicates reserved for future use.

FIG. 6 is a diagram for describing the operation of a memory device according to some example embodiments.

Referring to FIGS. 2 and 6, in some example embodiments, the memory device 20 may operate in one of a first mode and a second mode.

In the first mode, as described above, a control logic 210 may generate an internal mode register write command IMRW in response to a refresh command REF. Accordingly, the control logic 210 may store a bank address and a row address, on which a refresh operation is performed, in a mode register 212.

In the second mode, even when the refresh command REF is received, the control logic 210 may not generate the internal mode register write command IMRW. That is, the memory device 20 may not separately store the bank address and the row address, on which the refresh operation is performed, in the mode register 212.

Accordingly, an operation mode of the memory device 20 may be changed as desired to store or not store the bank address and the row address on which the refresh operation is performed.

For example, the first mode may be a test mode in which a test is performed on the memory device 20, and the second mode may be a user mode in which a user uses the memory device 20. Accordingly, it may be possible to prevent the overhead of the memory device 20 due to a write operation of a bank address and a row address.

In some example embodiments, the operation mode of the memory device 20 may be determined by mode information stored in the mode register 212. Referring to FIG. 6, for example, the memory device 20 may operate in one of the first mode and the second mode according to the mode information stored in the storage area OP[1] of the mode register MR64. The mode information may be stored in the mode register MR64, which stores bank addresses BA0 to BA2 on which a refresh operation is performed.

FIG. 7 is an example diagram for describing a mode register.

Referring to FIG. 7, in some example embodiments, a bank address and a row address on which a refresh operation is performed may be stored in mode registers MR64, MR66, and MR67 which are not consecutive to each other among blank mode registers MR64, MR65, MR66, and MR67 according to a specification of a memory device.

For example, bank addresses BA0, BA1, and BA2 may be stored in storage areas OP[7], OP[6], and OP[5], respectively, of the mode register MR64. Row addresses RA8 to RA15 may be stored in storage areas OP[0], OP[1], OP[2], OP[3], OP[4], OP[5], OP[6], and OP[7], respectively, of the mode register MR66. Row addresses RA0 to RA7 may be stored in storage areas OP[0], OP[1], OP[2], OP[3], OP[4], OP[5], OP[6], and OP[7], respectively, of the mode register MR67.

Figures 8, 9:
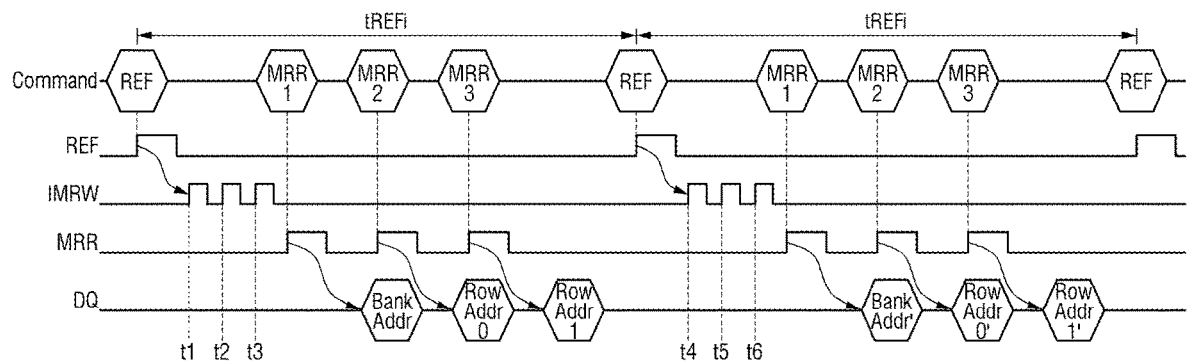
FIG. 8 is an example diagram for describing a mode register.
FIG. 9 is a diagram for describing the operation of a memory device according to some example embodiments.

FIG. 8 is an example diagram for describing a mode register.

Referring to FIG. 8, in some example embodiments, a memory device 20 may operate in one of a first mode and a second mode according to mode information stored in a storage area OP[0] of a mode register MR67. In the mode register MR67 in which the mode information is stored, the mode information may be stored in the mode register MR67 that is different from mode registers MR64, MR65, and MR66 in which a bank address and a row address on which a refresh operation is performed are stored.

In other implementations, a mode register, to which a bank address and a row address on which a refresh operation is performed are written, and a mode register, to which mode information is written, may be any mode register among blank mode registers according to a specification of the memory device 20.

FIG. 9 is a diagram for describing the operation of a memory device according to some example embodiments.

Referring to FIGS. 2 and 9, a memory device 20 may operate in a first mode. The control logic 210 may generate an internal mode register write command IMRW in response to a refresh command REF. The internal mode register write command IMRW may instruct a bank address or a row address to be written to the same mode register 212. That is, the bank address or row address written to the mode register 212 in response to the refresh command REF may be valid for one refresh period tREFi.

For example, the internal mode register write command IMRW may instruct the bank address to be stored in a first mode register and the row address to be stored in second and third mode registers. Mode register read commands MRR1, MRR2, and MRR3 may instruct to read the first to third mode registers, respectively. That is, the bank addresses and row addresses written to the first to third mode registers may be updated whenever a refresh operation is performed in response to the refresh command REF.

In response to the internal mode register write commands IMRW generated at time points t1, t2, and t3, a bank address Bank Addr and row addresses Row Addr0 and Row Addr1 written to the mode register 212 may be read in response to the mode register read commands MRR1, MRR2, and MRR3. In response to the internal mode register write commands IMRW generated at times points t4, t5, and t6, a bank addresses Bank Addr' and row addresses Row Addr0' and Row Addr1' written to the mode register 212 may be read in response to the mode register read commands MRR1, MRR2, and MRR3.

Figure 10:
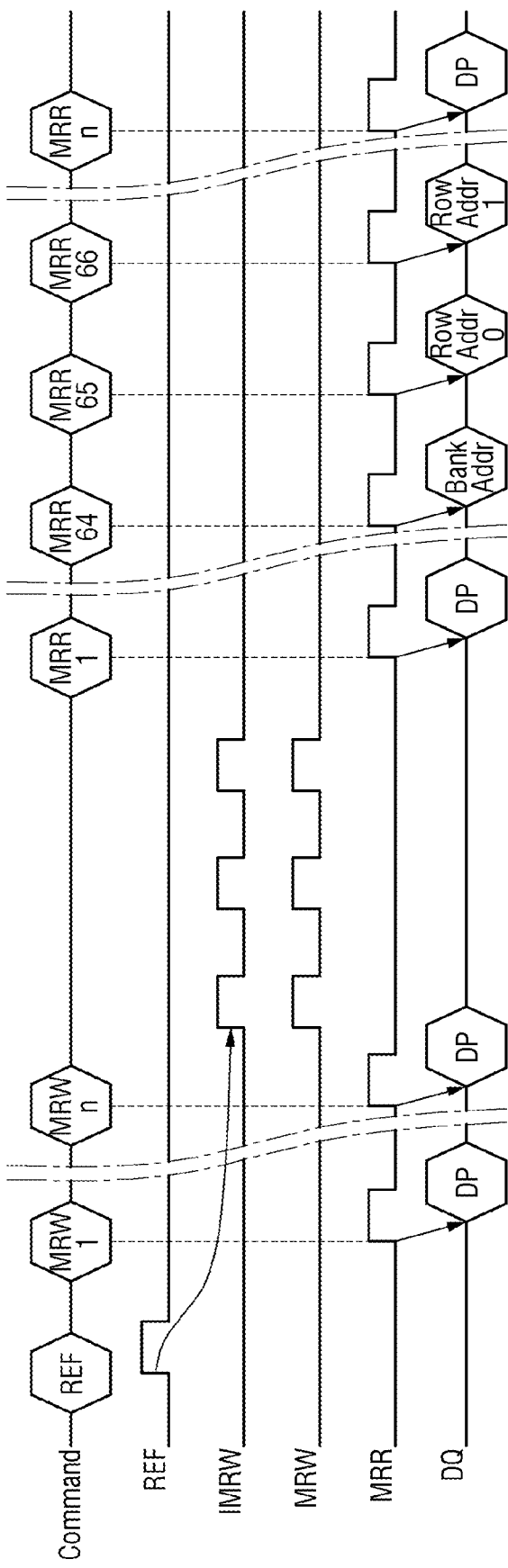
FIG. 10 is a diagram for describing the operation of a memory device according to some example embodiments.

FIG. 10 is a diagram for describing the operation of a memory device according to some example embodiments.

Referring to FIG. 10, before a control logic generates an internal mode register write command IMRW in response to a refresh command REF, the memory device may receive a plurality of mode register write commands MRW1 to MRWn for instructing a pattern DP to be written to each of mode registers. For example, the mode registers may include first to $n^{th}$ mode registers, and each of the mode register write commands MRW1 to MRWn may instruct a write operation for each of the first to $n^{th}$ mode registers. Accordingly, the pattern DP may be written to the first to $n^{th}$ mode registers.

Next, a bank address and row addresses on which a refresh command is performed may be stored in the mode registers according to the internal mode register write command IMRW. For example, the bank address may be stored in the $64^{th}$ mode register, and the row addresses may be stored in the $65^{th}$ and $66^{th}$ mode registers.

Then, the memory device may receive mode register read commands MRR1 to MRRn for the first to $n^{th}$ mode registers. Accordingly, data may be read from the first to $n^{th}$ mode registers. In this case, the pattern DP may not be read from some mode registers, and the pattern DP may be read from the remaining mode registers, for example, the pattern DP may not be read from the $64^{th}$ to $66^{th}$ mode registers, and the pattern DP may be read from the mode registers excluding the $64^{th}$ to $66^{th}$ mode registers. A bank address and a row address may be read from the $64^{th}$ to $66^{th}$ mode registers by the internal mode register write command IMRW.

Figure 11:
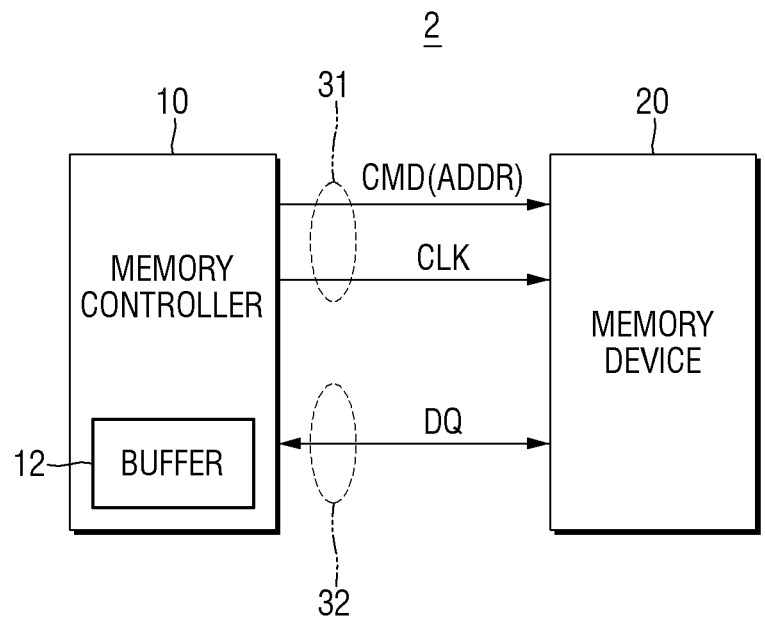
FIG. 11 is a block diagram for describing a memory system according to some example embodiments.
Figure 12:
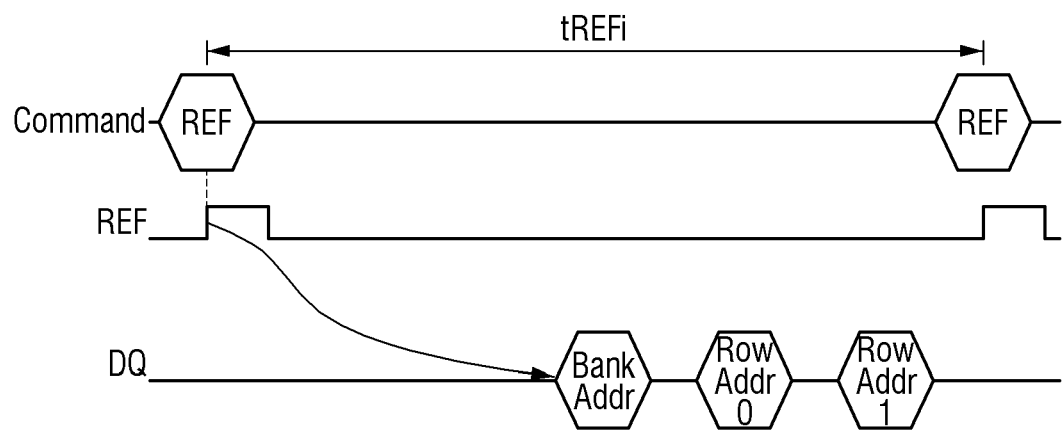
FIG. 12 is a diagram for describing the operation of a device of FIG. 11.

FIG. 11 is a block diagram for describing a memory system according to some example embodiments. FIG. 12 is a diagram for describing the operation of a device of FIG. 11. For convenience of description, descriptions will be provided based on different points from those described above.

Referring to FIGS. 11 and 12, a memory system 2 according to some example embodiments may include the memory controller 10 and the memory device 20. The memory controller 10 may include a buffer 12.

The memory device 20 may perform a refresh operation in response to a refresh command REF. In a first mode, the memory device 20 may output a bank address Bank Addr and row addresses Row Addr0 and Row Addr1 on which a refresh operation is performed in response to the refresh command REF. In a second mode, the memory device 20 may not output the bank address Bank Addr and the row addresses Row Addr0 and Row Addr1 on which the refresh operation is performed in response to the refresh command REF.

For example, in the first mode, the memory device 20 may generate an internal write command for writing the bank address Bank Addr and the row addresses Row Addr0 and Row Addr1, on which the refresh operation is performed, in a memory cell array, and may generate an internal read command for outputting the bank address Bank Addr and the row addresses Row Addr0 and Row Addr1. Accordingly, the memory device 20 may output the bank address Bank Addr and the row addresses Row Addr0 and Row Addr1.

For example, in the first mode, as described above, the memory device 20 may generate an internal mode register write command for writing the bank address Bank Addr and the row addresses Row Addr0 and Row Addr1, on which the refresh operation is performed, to mode resistors. Next, the memory device 20 may generate an internal register read command for outputting the bank address Bank Addr and the row addresses Row Addr0 and Row Addr1. Accordingly, the memory device 20 may output the bank address Bank Addr and the row addresses Row Addr0 and Row Addr1.

The memory controller 10 may receive the bank address Bank Addr and the row addresses Row Addr0 and Row Addr1 through the data bus 32. The memory controller 10 may store the bank address Bank Addr and the row addresses Row Addr0 and Row Addr1 in the buffer 12.

Figure 13:
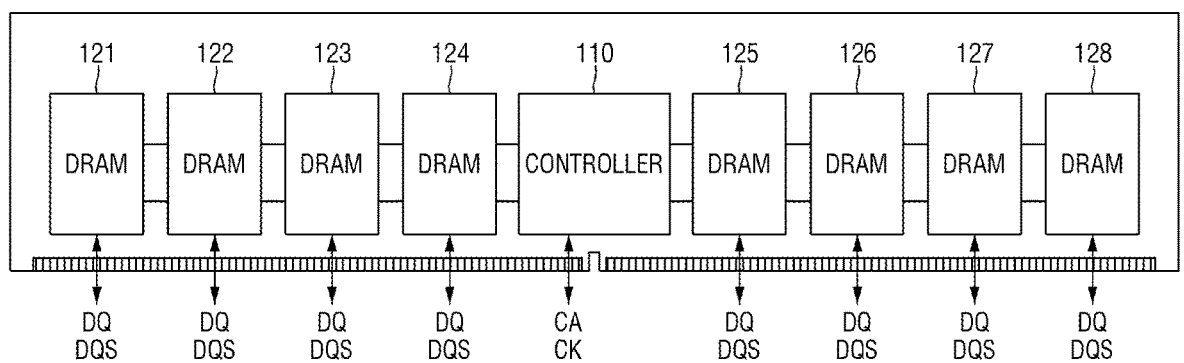
FIG. 13 is a diagram for describing a memory module according to some example embodiments.

FIG. 13 is a diagram for describing a memory module according to some example embodiments. For convenience of description, descriptions will be provided based on different points from those described above.

Referring to FIG. 13, a memory module 100 according to some example embodiments may include a controller 110 and a plurality of memory devices 121 to 128. The memory module 100 may be mounted on an electronic device.

A central processing unit (CPU) may control the memory module 100 according to a communication protocol such as a Double Data Rate (DDR) or a Low Power DDR (LPDDR). For example, in order to read data stored in the memory module 100, the CPU may transmit a command and an address to the memory module 100.

The plurality of memory devices 121 to 128 may write data or output written data under the control of the CPU. The plurality of memory devices 121 to 128 may each be at least one of a DRAM and an SDRAM.

The plurality of memory devices 121 to 128 may communicate data DQ with the CPU in response to a signal provided from the controller 110. According to some example embodiments, the plurality of memory devices 121 to 128 may further include data buffers for data communication. The data buffers may transmit or receive the data DQ to or from the CPU in synchronization with data strobe signals DQS. In another implementation, the plurality of memory devices 121 to 128 may communicate the data DQ with the CPU through the controller 110.

According to some example embodiments, the controller 110 may communicate with the memory devices 121 to 128 according to one of memory module standards such as a dual in-line memory module (DIMM), a registered DIMM (RDIMM), a load reduced DIMM (LRDIMM), and an unbuffered DIMM (UDIMM).

According to some example embodiments, the controller 110 may receive a command/address CA and a clock signal CK of the memory module 100 through memory input/output pins, and may provide received signals to the memory devices 121 to 128.

In some example embodiments, in a first mode, the plurality of memory devices 121 to 128 may output a bank address and a row address, on which a refresh operation is performed, in response to a refresh command. In a second mode, the plurality of memory devices 121 to 128 may not output the bank address and the row address, on which the refresh operation is performed, in response to the refresh command.

In some example embodiments, the bank address and the row address on which the refresh operation is performed may be output to the CPU in synchronization with the data strobe signals DQS.

In some example embodiments, the controller 110 may receive the bank address and the row address, on which the refresh operation is performed, from the plurality of memory devices 121 to 128, and may store the received bank address and row address. For example, the controller 110 may include a register clock driver (RCD), and the RCD may store the bank address and the row address on which the refresh operation is performed.

Figure 14:
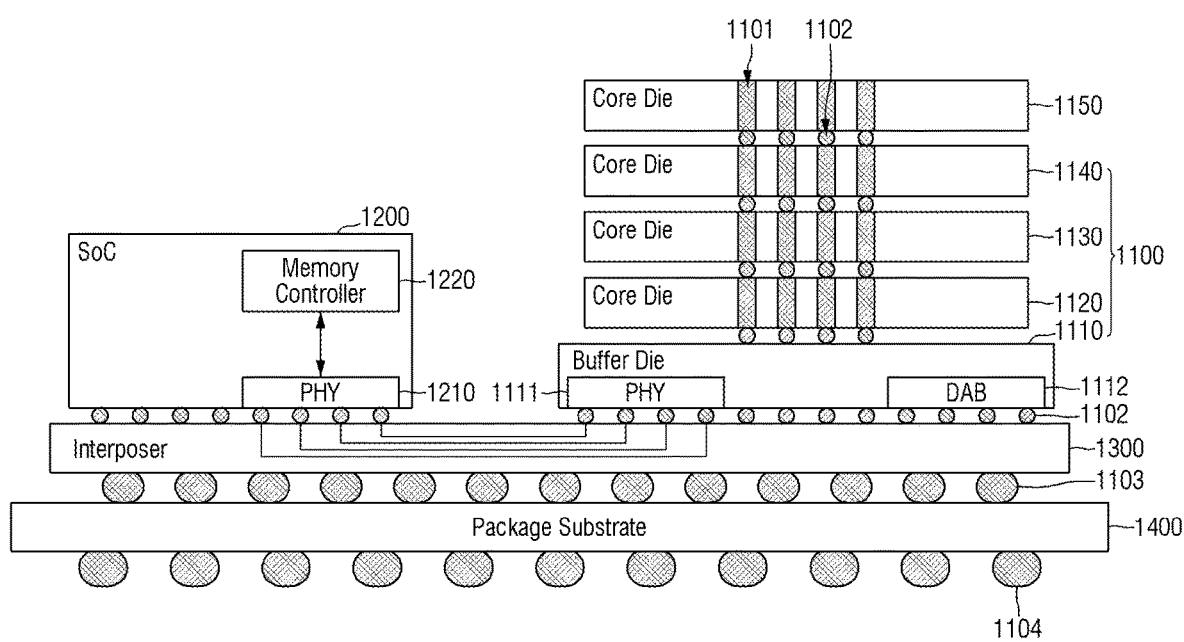
FIG. 14 is a diagram of a semiconductor package according to some example embodiments.

FIG. 14 is a diagram of a semiconductor package according to some example embodiments.

Referring to FIG. 14, a semiconductor package 1000 may include a stack type memory device 1100, a system-on-chip 1200, an interposer 1300, and a package substrate 1400. The stack type memory device 1100 may include a buffer die 1110 and core dies 1120 to 1150.

Each of the core dies 1120 to 1150 may include a memory cell array. The core dies 1120 to 1150 may include the memory device 20 described with reference to FIGS. 1 to 12. The buffer die 1110 may include a physical layer (PHY) 1111 and a direct access area (DAB) 1112. The physical layer 1111 may be electrically connected to a physical layer 1210 of the system-on-chip 1200 through the interposer 1300. The stack type memory device 1100 may receive signals from the system-on-chip 1200 or transmit signals to the system-on-chip 1200 through the physical layer 1111.

The direct access area 1112 may provide an access path through which the stack type memory device 1100 may be tested without passing the system-on-chip 1200. The direct access area 1112 may include a conductive portion (for example, a port or a pin) through which communication may be performed directly with an external test device. A test signal and data received through the direct access area 1112 may be transmitted to the core dies 1120 to 1150 through through-silicon vias (TSVs). Data read from the core dies 1120 to 1150 so as to test the core dies 1120 to 1150 may be transmitted to the test device through the TSVs and the direct access area 1112. Accordingly, a direct access test may be performed on the core dies 1120 to 1150.

The buffer die 1110 and the core dies 1120 to 1150 may be electrically connected to each other through TSVs 1101 and bumps 1102. The buffer die 1110 may receive signals, which are to be provided to each channel, from the system-on-chip 1200 through the bumps 1102 allocated for each channel. For example, the bumps 1102 may be micro-bumps.

The system-on-chip 1200 may execute applications supported by the semiconductor package 1000 using the stack type memory device 1100. For example, the system-on-chip 1200 may include at least one processor of a CPU, an application processor (AP), a graphic processing unit (GPU), a neural processing unit (NPU), a tensor processing unit (TPU), a vision processing unit (VPU), an image signal processor (ISP), and a digital signal processor (DSP) to execute specialized calculations.

The system-on-chip 1200 may include the physical layer 1210 and a memory controller 1220. The physical layer 1210 may include input/output circuits for transmitting or receiving signals to or from the physical layer 1111 of the stack type memory device 1100. The system-on-chip 1200 may provide various signals to the physical layer 1111 through the physical layer 1210. The signals provided to the physical layer 1111 may be transmitted to the core dies 1120 to 1150 through interface circuits of the physical layer 1111 and the TSVs 1101.

The memory controller 1220 may control the overall operation of the stack type memory device 1100. The memory controller 1220 may transmit signals for controlling the stack type memory device 1100 to the stack type memory device 1100 through the physical layer 1210. The memory controller 1220 may correspond to the memory controller 10 of FIG. 1.

The interposer 1300 may connect the stack type memory device 1100 and the system-on-chip 1200. The interposer 1300 may provide physical paths through which the physical layer 1111 of the stack type memory device 1100 and the physical layer 1210 of the system-on-chip 1200 are connected and which are formed using conductive materials. Accordingly, the stack type memory device 1100 and the system-on-chip 1200 may be stacked on the interposer 1300 to transmit/receive signals to or from each other.

Bumps 1103 may be attached to an upper portion of the package substrate 1400, and solder balls 1104 may be attached to a lower portion of the package substrate 1400. For example, the bumps 1103 may be flip-chip bumps. The interposer 1300 may be stacked on the package substrate 1400 through the bumps 1103. The semiconductor package 1000 may transmit/receive signals to or from other external packages or semiconductor devices through the solder balls 1104. For example, the package substrate 1400 may be a printed circuit board (PCB).

Figure 15:
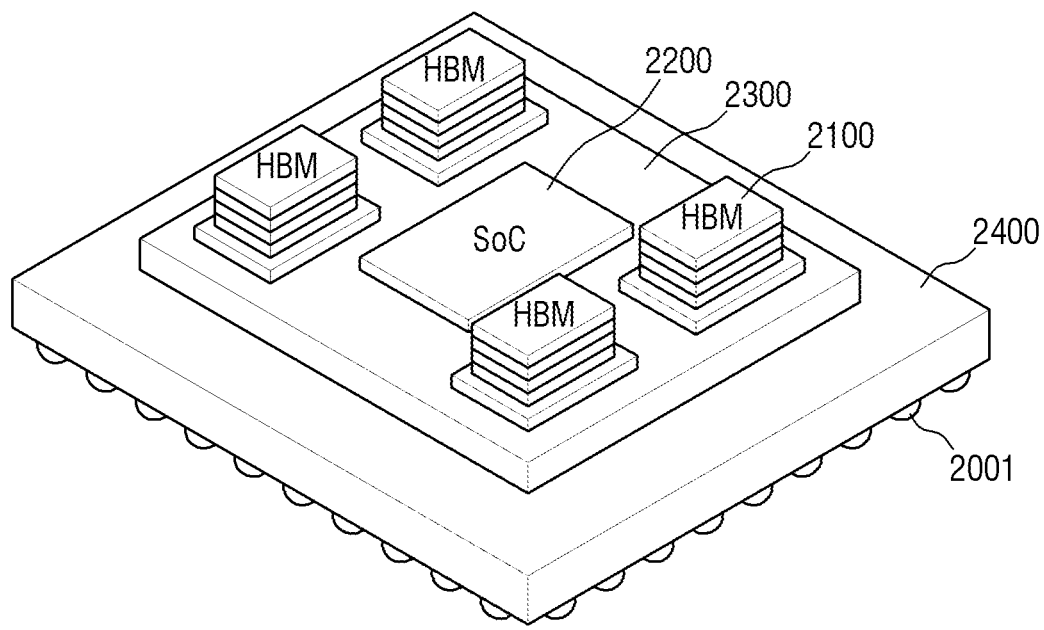
FIG. 15 is a diagram of an implementation example of a semiconductor package according to some example embodiments.

FIG. 15 is a diagram of an implementation example of a semiconductor package according to some example embodiments.

Referring to FIG. 15, a semiconductor package 2000 may include a plurality of stack type memory devices 2100 and a system-on-chip 2200. The stack type memory devices 2100 and the system-on-chip 2200 may be stacked on an interposer 2300, and the interposer 2300 may be stacked on a package substrate 2400. The semiconductor package 2000 may transmit or receive signals to or from other external packages or semiconductor devices through solder balls 2001 attached to a lower portion of the package substrate 2400.

Each of the stack type memory devices 2100 may be implemented based on a high bandwidth memory (HBM) standard. However, each of the stack type memory devices 2100 may be implemented based on a graphics double data rate (GDDR), HMC, or wide I/O standard. Each of the stack type memory devices 2100 may correspond to the stack type memory device 1100 of FIG. 14.

The system-on-chip 2200 may include at least one processor of a CPU, an AP, a GPU, and an NPU, and may include a plurality of memory controllers for controlling the plurality of stack type memory devices 2100. The system-on-chip 2200 may transmit or receive signals to or from a corresponding stack type memory device through the memory controller. The system-on-chip 2200 may correspond to the system-on-chip 1200 of FIG. 14.

Figure 16:
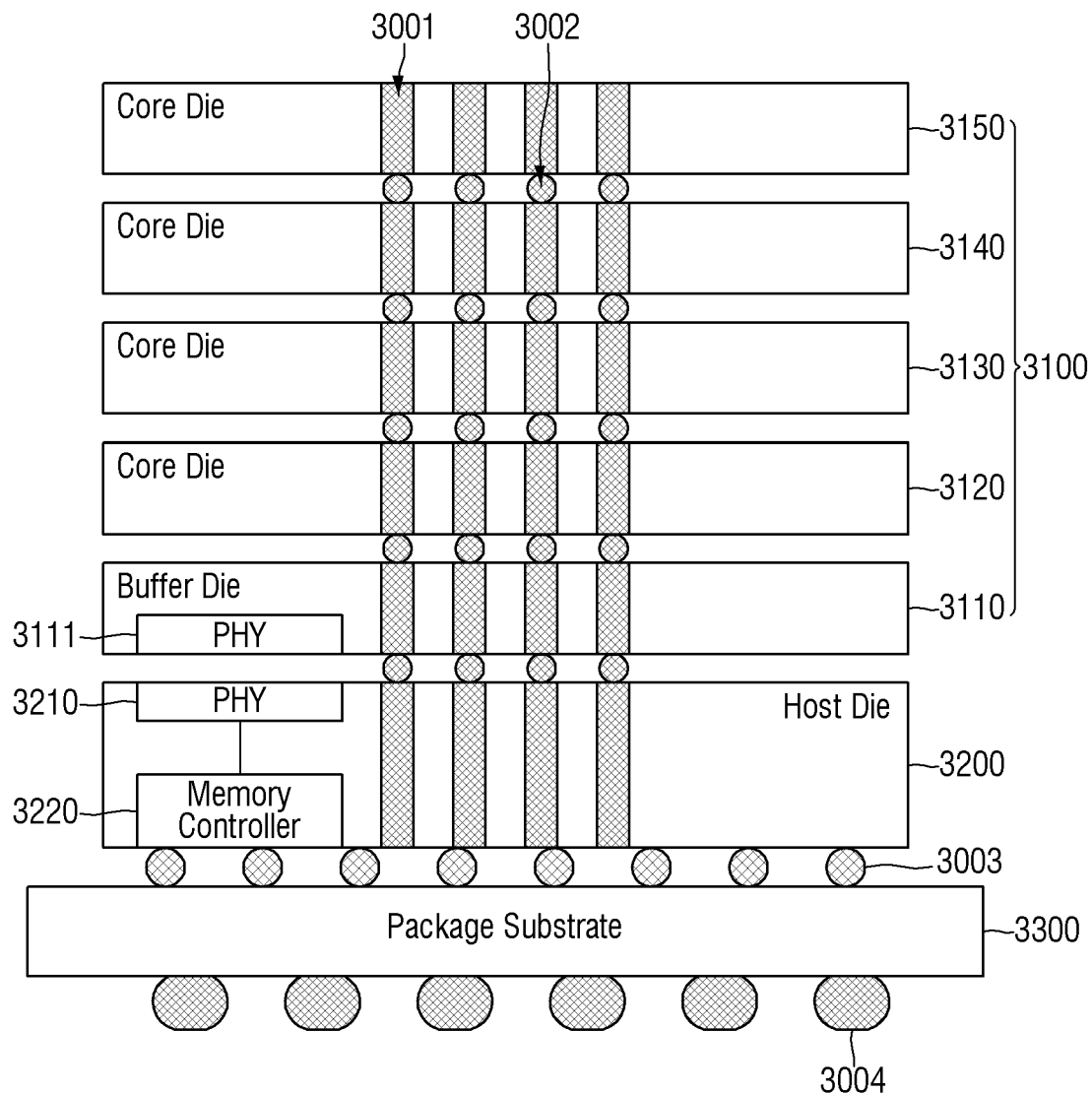
FIG. 16 is a diagram of a semiconductor package according to some example embodiments.

FIG. 16 is a diagram of a semiconductor package according to some example embodiments.

Referring to FIG. 16, a semiconductor package 3000 may include a stack type memory device 3100, a host die 3200, and a package substrate 3300. The stack type memory device 3100 may include a buffer die 3110 and core dies 3120 to 3150. The buffer die 3110 may include a physical layer 3111 for communication with the host die 3200. Each of the core dies 3120 to 3150 may include a memory cell array.

The host die 3200 may include a physical layer 3210, for communication with the stack type memory device 3100, and a memory controller 3220, for controlling the overall operation of the stack type memory device 3100. In addition, the host die 3200 may include a processor for controlling the overall operation of the semiconductor package 3000 and executing an application supported by the semiconductor package 3000. For example, the host die 3200 may include at least one processor of a CPU, an AP, a GPU, and an NPU.

The stack type memory device 3100 may be disposed on the host die 3200 based on TSVs 3001 and vertically stacked on the host die 3200. Accordingly, the buffer die 3110, the core dies 3120 to 3150, and the host die 3200 may be electrically connected to each other through the TSVs 3001 and bumps 3002 without an interposer. For example, the bumps 3002 may be micro-bumps.

Bumps 3003 may be attached to an upper portion of the package substrate 3300, and solder balls 3004 may be attached to a lower portion of the package substrate 3300.

For example, the bumps 3003 may be flip-chip bumps. The host die 3200 may be stacked on the package substrate 3300 through the bumps 3003. The semiconductor package 3000 may transmit or receive signals to or from other external packages or semiconductor devices through the solder balls 3004.

By way of summation and review, as the degree of integration of a memory increases, an interval between a plurality of word lines included in the memory decreases. As the interval between the word lines decreases, a coupling effect between the adjacent word lines increases. Whenever data is input to or output from a memory cell, a word line toggles between an active state and an inactive state, and as described above, as a coupling effect between adjacent word lines is increased, data may be damaged in memory cells coupled to word lines that are adjacent to a frequently activated word line. Such a phenomenon is referred to as row hammering, and due to word line disturbance, before a memory cell is refreshed, data of the memory cell may be damaged.

Row hammer may occur when a specific row is repeatedly activated during DRAM operation. When this phenomenon occurs, the rows on both sides of the row may be subjected to electromagnetic interference (the closer the distance and the stronger the interference, as DRAM shrinks down), and when such interference occurs intensively and repeatedly, on both sides of the row there is a possibility of data being changed, e.g., a bit of the adjacent row flipping. To address this, a target row refresh technique may be used (the target row may be selected as a refresh candidate when the number of active rows exceeds a specific value after counting). The row hammer solution through the target row refresh technique may store the row address and the number of active times of that address in a table. However, when the target row refresh technique and general refresh work together, it may be difficult to track the address when analyzing DRAM. As a result, the accuracy of REF-related items may decrease during product operation verification and defect analysis, and additional issues may arise. Example embodiments may therefore provide a DFT that can be directly observed by storing the refresh address.

As described above, embodiments may provide a memory device capable of reading a bank address and a row address on which a refresh operation is performed. Aspects of the present disclosure may provide a memory system capable of reading a bank address and a row address on which a refresh operation is performed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a memory cell array including a plurality of memory cells; and
a control logic including a mode register, the control logic configured to:
perform a first refresh operation in response to a first refresh command,
generate an internal mode register write command in response to the first refresh command in a first mode,
in the first mode, write a bank address and a row address, on which the first refresh operation is performed, to the mode register in response to the internal mode register write command, and
perform a second refresh operation in response to a second refresh command in a second mode different from the first mode, wherein:
the internal mode register write command includes a first internal mode register write command and a second internal mode register write command,
the mode register includes a first mode register and a second mode register, and
the control logic is configured to write the bank address to the first mode register in response to the first internal mode register write command, and write the row address to the second mode register in response to the second internal mode register write command.

2. The memory device as claimed in claim 1, wherein the control logic is configured to generate the first internal mode register write command, and then generate the second internal mode register write command.

3. The memory device as claimed in claim 1, wherein the control logic is configured to generate the second internal mode register write command and then generates the first internal mode register write command.

4. The memory device as claimed in claim 1, wherein the first mode register and the second mode register are consecutive.

5. The memory device as claimed in claim 1, wherein the control logic is configured to:
write mode information to the first mode register, and
operate in one of the first mode and the second mode according to the mode information.

6. The memory device as claimed in claim 1, wherein:
the mode register further includes a third mode register, and
the control logic is configured to:
write mode information to the third mode register in response to the mode register write command, and
operate in one of the first mode and the second mode according to the mode information.

7. A memory system, comprising:
a memory controller configured to generate a refresh command; and
a memory device which includes a memory cell array and a control logic, the memory cell array including a plurality of memory cells, the control logic including a mode register and configured to perform a refresh operation in response to the refresh command,
wherein the memory device is configured to:
store a bank address and a row address, on which the refresh operation is performed, in the mode register, and
output the bank address and the row address from the mode register to the memory controller outside the memory device in response to a mode register read command received from the memory controller,
wherein, in a first mode, the control logic is configured to store the bank address and the row address in the mode register in response to the refresh command,
wherein the mode register read command includes first and second mode register read commands, and wherein the memory device is configured to output one of the bank address and the row address to the memory controller in response to the first mode register read command and output the other of the bank address and the row address to the memory controller in response to the second mode register read command.

8. The memory system as claimed in claim 7, wherein:
the mode register includes a first mode register and a second mode register, and
the control logic is configured to store the bank address in the first mode register and store the row address in the second mode register.

9. The memory system as claimed in claim 8, wherein the first mode register and the second mode register are consecutive.

10. The memory system as claimed in claim 7, wherein the control logic is configured to:
write mode information to the mode register in response to a mode register write command from the memory controller, and
operate in one of the first mode and a second mode different from the first mode according to the mode information.

11. The memory system as claimed in claim 10, wherein:
the mode register includes a first mode register and a second mode register, and
the control logic is configured to store the mode information and the bank address in the first mode register, and store the row address in the second mode register.

12. The memory system as claimed in claim 10, wherein:
the mode register includes a first mode register, a second mode register, and a third mode register, and
the control logic is configured to store the mode information in the first mode register, store the bank address in the second mode register, and store the row address in the third mode register.

13. The memory system as claimed in claim 7, wherein:
the memory controller includes a register clock driver, and
the register clock driver is configured to store the bank address and the row address.

14. A memory device, comprising:
a memory cell array including a plurality of memory cells; and
a control logic including a mode register, wherein:
the control logic is configured to:
receive a first refresh command and a second refresh command after receiving the first refresh command,
perform a first refresh operation in response to the first refresh command, and a second refresh operation in response to the second refresh command,
store a first bank address and a first row address, on which the first refresh operation is performed, in the mode register in response to the first refresh command,
store a second bank address and a second row address, on which the second refresh operation is performed, in the mode register in response to the second refresh command,
output the first bank address and the first row address from the mode register to an outside of the memory device in response to a first mode register read command from the outside of the memory device in at least a portion of a period in which the first refresh operation is performed by receiving the first refresh command, and
output a second bank address and a second row address to the outside of the memory device from the mode register in response to a second mode register read command from the outside of the memory device in at least a portion of a period in which the second refresh operation is performed by receiving the second refresh command,
the second bank address is different from the first bank address, and
the second row address is different from the first row address.

* * * * *